(12) United States Patent
Lee et al.

(10) Patent No.: US 8,048,795 B2
(45) Date of Patent: Nov. 1, 2011

(54) SELF-ASSEMBLY PATTERN FOR SEMICONDUCTOR INTEGRATED CIRCUIT

(75) Inventors: Tsung-Lin Lee, Hsinchu (TW); Clement Hsingjen Wann, Carmel, NY (US); Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 34 days.

(21) Appl. No.: 12/610,282

(22) Filed: Oct. 31, 2009

(65) Prior Publication Data

US 2011/0008956 A1 Jan. 13, 2011

Related U.S. Application Data

(60) Provisional application No. 61/224,660, filed on Jul. 10, 2009.

(51) Int. Cl.
*H01L 21/4763* (2006.01)

(52) U.S. Cl. ........ 438/618; 438/128; 438/589; 438/700; 257/E21.536; 257/E21.575; 257/E21.602

(58) Field of Classification Search ................. 438/320, 438/339, 599; 257/E21.234, E21.483, E21.486, 257/E21.497, E21.532, E21.533, E21.536, 257/E21.598
See application file for complete search history.

(56) References Cited

U.S. PATENT DOCUMENTS

2004/0175628 A1* 9/2004 Nealey et al. ............... 430/1
2009/0240001 A1* 9/2009 Regner ........................ 525/95
* cited by examiner

*Primary Examiner* — Walter L Lindsay, Jr.
*Assistant Examiner* — Cheung Lee
(74) *Attorney, Agent, or Firm* — Haynes and Boone, LLP

(57) ABSTRACT

A method of fabricating a semiconductor device is provided which includes providing a substrate. A material layer is formed over the substrate. A polymer layer is formed over the material layer. A nano-sized feature is self-assembled using a portion of the polymer layer. The substrate is patterned using the nano-sized feature.

20 Claims, 14 Drawing Sheets

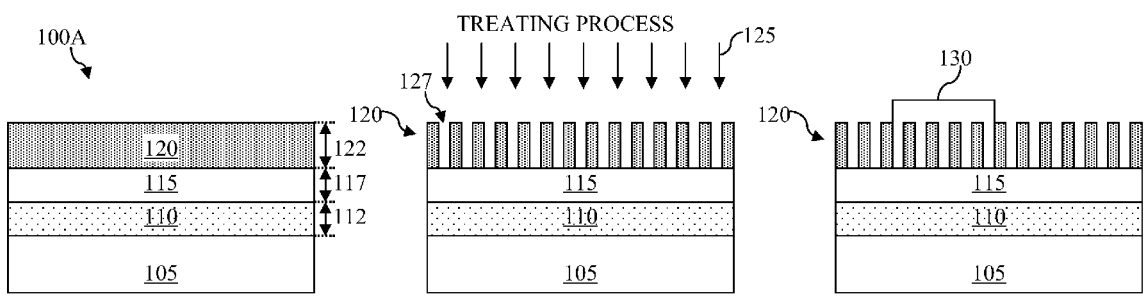
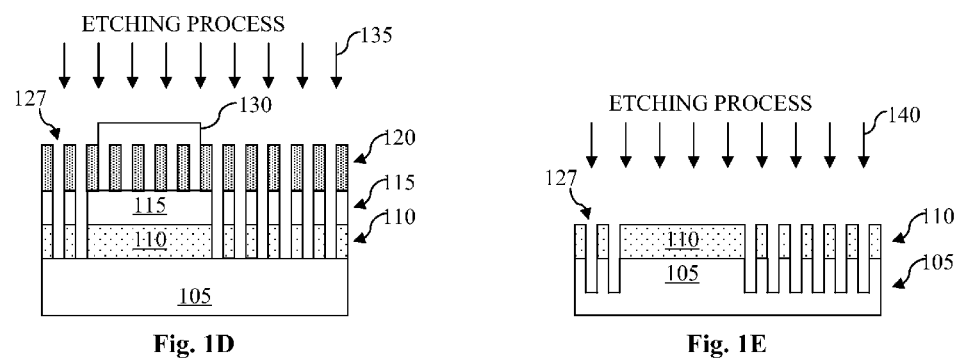

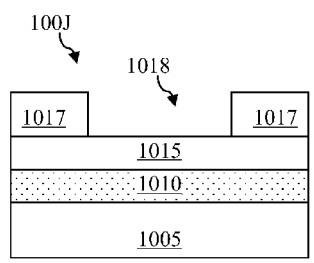
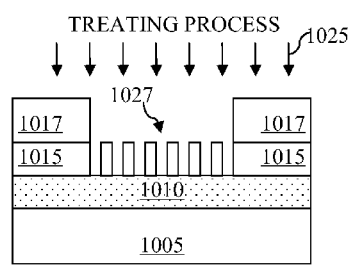
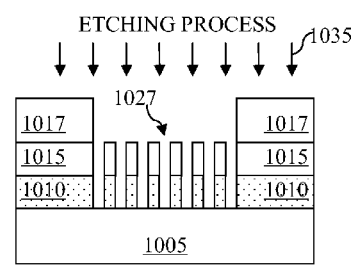
Fig. 10A     Fig. 10B     Fig. 10C
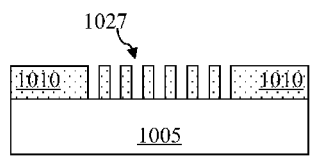
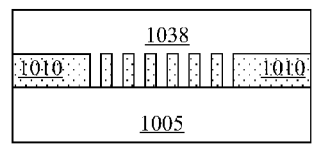
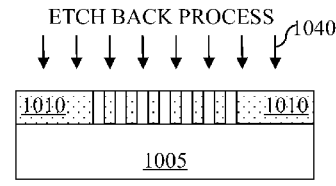
Fig. 10D     Fig. 10E     Fig. 10F
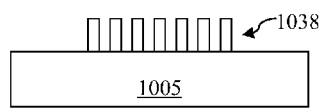
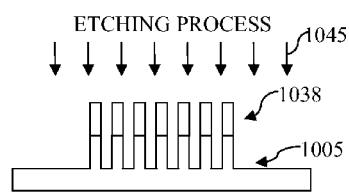
Fig. 10G     Fig. 10H

SELF-ASSEMBLY PATTERN FOR SEMICONDUCTOR INTEGRATED CIRCUIT

PRIORITY DATA

This application claims priority to Provisional Application Ser. No. 61/224,660, filed on Jul. 10, 2009, entitled "SELF-ASSEMBLY PATTERN FOR SEMICONDUCTOR INTEGRATED CIRCUIT," the entire disclosure of which is incorporated herein by reference.

TECHNICAL FIELD

The present disclosure relates generally to a semiconductor device, and more particularly, to a method of fabricating a semiconductor integrated circuit.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As geometry size continues to be scaled down, it is increasingly more difficult for conventional photolithography processes to pattern IC features. Further, smaller geometry sizes lead to other challenging issues, such as pattern uniformity and feature alignment.

Therefore, while existing methods of fabricating semiconductor integrated circuit devices have been generally adequate for their intended purposes, they have not been entirely satisfactory in every aspect.

SUMMARY

One form of the present disclosure involves a method of fabricating a semiconductor device. The method includes, providing a substrate; forming a material layer over the substrate; forming a polymer layer over the material layer; self-assembling a nano-sized feature using a portion of the polymer layer; and patterning the substrate using the nano-sized feature.

Another form of the present disclosure involves a method of fabricating a semiconductor device. The method includes, providing a substrate; forming a guiding layer over the substrate, the guiding layer having a recess; forming a polymer layer within the recess, the polymer layer having first and second components; treating the polymer layer to facilitate a separation of the first and second components; removing the second component, thereby forming an opening within the polymer layer; and extending the opening into the substrate.

Still another form of the present disclosure involves a method of fabricating a semiconductor device. The method includes providing a substrate; forming a material layer over the substrate; forming a guiding layer over the material layer, the guiding layer having a recess over a region of the substrate; forming a polymer layer within the recess, wherein an interfacial energy exists between the material layer and the polymer layer; transforming the polymer layer into a mask that has a predetermined structure that is associate with the interfacial energy; and performing a patterning process using the mask.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1 to 14 illustrate cross-sectional views of a semiconductor device at various stages of fabrication in accordance with various embodiments.

DETAILED DESCRIPTION

Figure 2A:
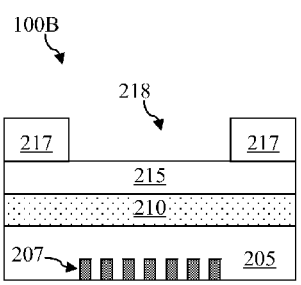

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIGS. 1 to 14 are diagrammatic fragmentary cross-sectional side views of a semiconductor device 100 during various fabrication stages in accordance with various embodiments. The semiconductor device 100 may be an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 1-14 have been simplified for a better understanding of the inventive concepts of the present disclosure.

Referring to FIG. 1A, the semiconductor device 100A includes a layer 105. The layer 105 is a semiconductor substrate in the present embodiment. For example, the layer 105 may be a silicon substrate. It is understood that the substrate is defined broadly to include interconnect layers. The layer 105 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In other embodiments, the layer 105 may include a non-semiconductor material such as a glass substrate for thin-film-transistor liquid crystal display (TFT-LCD) devices, or fused quartz or calcium fluoride for a photomask (mask). In further embodiments, the layer 105 may be a hard mask layer that contains silicon nitride, silicon oxynitride, or silicon oxide. In yet other embodiments, the layer 105 may include poly silicon, amorphous silicon, or tri-layer photoresist. In some embodiments, the layer 105 may include various doped regions and/or dielectric features for various microelectronic components, such as a complementary metal-oxide-semiconductor field-effect transistor (CMOSFET), imaging sensor, memory cell, and/or capacitive element.

A hard mask layer 110 is then formed over the layer 105. The hard mask layer 110 includes a dielectric material such as silicon oxide or silicon nitride. Alternatively, the hard mask layer 110 may include a metallic material such as Chromium (Cr). The hard mask layer 110 is formed using a process such as chemical vapor deposition (CVD), physical vapor deposition (PVD), atomic layer deposition (ALD), or another suitable technique known in the art. The hard mask layer 110 has a thickness 112 that is in a range between about 50 nanometers (nm) to about 100 nm.

A polymer layer 115 is formed over the hard mask layer 110. The polymer layer 115 includes a diblock copolymer that has a polystyrene component (PS block) and a polymethyl methacrylate component (PMMA block). The polymer layer 115 is formed by a spin coating process that is followed by an optional baking process. In an embodiment, the diblock copolymer in the polymer layer 115 is composed of the PS and PMMA components with volume fractions of about 50% and 50%, respectively. Alternatively stated, the volume ratio of the PS to PMMA components is about 1:1. The polymer layer 115 has a thickness 117 that is in a range from about 2.5 nm to about 10 nm, for example about 5 nm.

A polymer layer 120 is then formed over the polymer layer 115. The polymer layer 120 includes a diblock copolymer that has a PS component and a PMMA component. The polymer layer 120 is formed by a spin coating process that is followed by an optional baking process. In an embodiment, the diblock copolymer in the polymer layer 120 is composed of the PS and PMMA components with volume fractions that are in ranges of about 70-80% and 20-30%, respectively. Alternatively stated, the volume ratio of the PS to PMMA components is in a range from about 2.33:1 to about 4:1. The polymer layer 120 has a thickness 122 that is in a range from about 15 nm to about 60 nm, for example about 30 nm. A solvent polarity of the polymer layer 120 is different from a solvent polarity of the polymer layer 115.

Referring to FIG. 1B, a treating process 125 is performed on the polymer layer 120. The treating process 125 includes one or more of the following processes: baking, ultraviolet curing, laser annealing, spike annealing, flash annealing, plasma treating, ion bombardment, and cross linking. The treating process 125 facilitates a microphase separation of the PS and PMMA components of the polymer layer 120, so that the PS and PMMA components form an ordered array. The shape and pattern of the ordered array formed by the PS and PMMA components may be referred to as the morphology of the diblock copolymer, and it is determined by the material composition of a layer interfacing with the polymer layer 120. In the embodiment shown in FIG. 1B, the layer interfacing with the polymer layer 120 is the polymer layer 115.

Essentially, an interfacial energy (or boundary energy) exists between the polymer layers 115 and 120. This interfacial energy causes a greater affinity to exist between either the polymer layer 115 and the PS components of the polymer layer 120 or the polymer layer 115 and the PMMA components of the polymer layer 120. Depending on which affinity is greater, the morphology of the diblock copolymer is determined. In an embodiment, the 1:1 volume ratio of the PS to PMMA components of the polymer 115 means that the affinity between the PS components and the polymer layer 115 is approximately equal to the affinity between the PMMA components and the polymer layer 115. As a result, the resulting morphology of the diblock copolymer molecule includes a cylindrically shaped and vertically oriented PMMA block having strands of PS blocks attached thereon. In other embodiments, the polymer layer 115 may have different volume ratios of the PS components to PMMA components, or is composed of a different material altogether, such that either the PS component or the PMMA component has a greater affinity with the polymer layer 115. In these alternative embodiments, resulting morphology of the diblock copolymer molecule may include a plate-like (lamella-shaped) and vertically oriented PMMA block having strands of PS blocks attached on either side of the plate. Thus, the material composition of the polymer layer 115, including the volume ratio between the PS and PMMA components, may be used to control the morphology or shape of the polymer layer 120. Furthermore, the sizes (or lengths) of the components of the polymer layer 120 may not be equal to each other. These varying size differences may be referred to as dispersion, which may be tuned during the polymerization process used to form the diblock copolymers. In some embodiments, the degree of dispersion may also be used to control the morphology of the polymer layer 120.

After the polymer layer 120 achieves a desired morphology, the PMMA components of the polymer layer 120 are selectively removed, for example by an etching process. As illustrated in FIG. 1B, the remaining portions of the polymer layer 120 form nano-sized features (features whose size are on the order of nanometers) that are essentially the array of the PS components that are left after the removal of the PMMA components. This may also be referred to as a self-assembly process, because the nano-sized features are not formed through photolithography but rather are self-assembled due to the material characteristics of the polymer layer 120 and the application of suitable parameters for the treating process 125. These nano-sized features are separated by openings 127. The size of the openings 127 are correlated to the lengths of the PMMA components of the copolymer that are removed, and the sizes of the nano-sized features formed by the remaining portions of the polymer layer 120 are correlated to the lengths of the PS components of the copolymer. In an embodiment, the remaining portions of the polymer layer 120 form approximately evenly spaced openings 127 that are cylindrical holes having diameters of about 20 nm. These openings 127 may be filled with a conductive material to form contacts or vias in a later process. In another embodiment associated with the lamella-shaped morphology, the remaining portions of the polymer layer 120 form approximately evenly spaced openings 127 that are trenches having widths of about 20 nm. These openings 127 may be filled with a conductive material to form conductive lines (interconnect lines) in a later process.

Referring now to FIG. 1C, a patterned mask 130 is formed over a portion of the polymer layer 120. The patterned mask 130 includes a non-reactive material that substantially does not react with the polymer layers 120 and 115 therebelow. In an embodiment, the non-reactive material of the patterned mask 130 includes an organic material, such as a positive or negative photoresist, and the patterned mask 130 is therefore referred to as a soft mask. In other embodiments, the patterned mask 130 may be a hard mask and may include a non-reactive dielectric material such as an oxide or a nitride. The patterned mask 130 is formed by coating or depositing the non-reactive material over the polymer layer 120 and patterning the non-reactive material with a photolithography process, so that the patterned mask 130 covers a region of the wafer where device features are not desired to be extremely small. This region may also be referred to as an unpack or decode region of the wafer.

Referring now to FIG. 1D, an etching process 135 is performed on the layers 115 and 110 to further extend the openings 127 through the layers 115 and 110, such that portions of the layer 105 are exposed. In an embodiment, the etching process includes a dry etching process to remove portions of the polymer layer 115 and the hard mask layer 110 that are not protected by the nano-sized features of the polymer layer 120 and the patterned mask 130.

Referring now to FIG. 1E, the layers 115, 120 and 130 are removed, and an etching process 140 is performed on the layer 105 using the hard mask layer 110 as a mask. The etching process 140 may include a wet etching process, a dry etching process, a reactive ion etching process, or combinations thereof. Portions of the layer 105 not protected by the hard mask layer 110 are removed by the etching process 140 to extend the openings 127 into the layer 105. As discussed above, the openings 127 may be filled with a conductive material to form an array of contacts, vias, or conductive lines.

In the embodiment described above, the patterned mask 130 serves as a guiding layer, so that the polymer layer 120 self-assembles within a desired region of the wafer. One of the advantages of the guiding layer 130 is that it improves alignment between various layers of the wafer, it being understood that different embodiments may offer different advantages. This will be described in more detail for other embodiments that will be discussed below.

Illustrated in FIGS. 2A-2E are diagrammatic fragmentary cross-sectional side views of the semiconductor device 100B during various fabrication stages in accordance with another embodiment of the present disclosure. The embodiment described below with reference to FIGS. 2A-2E is similar to the embodiment described with reference to FIGS. 1A-1E. The differences will be discussed below. Referring now to FIG. 2A, the semiconductor device 100B includes a layer 205 similar to the layer 105 of FIG. 1. The layer 205 includes an array of active devices 207 (also referred to as microelectronic devices). For example, the array active devices 207 may include the source or drain regions of a transistor. In alternative embodiments, the array of devices 207 may be passive devices, such as resistors or capacitors. These devices 207 may need to be interconnected to establish electrical connections with external devices. However, when these devices have very small feature sizes (for example, around 20 nm), accurate alignment between these small devices and their interconnections becomes challenging. The alignment concerns are alleviated by using the patterned mask 217 to control alignment, the details of which will be discussed shortly.

A hard mask layer 210 similar to the hard mask layer 110 of FIG. 1 is formed over the layer 205. A polymer layer 215 similar to the polymer layer 115 of FIG. 1 is then formed over the hard mask layer 210. Thereafter, a patterned mask 217 is formed over the polymer layer 215. The patterned mask 217 includes a material that is similar to the patterned mask 130 of FIG. 1. The patterned mask 217 includes an opening 218 (or recess) that is formed by a lithography process.

Figure 2B:
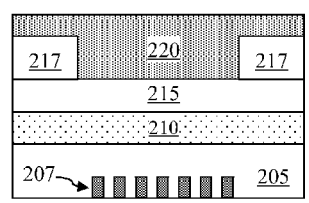
Figure 2C:
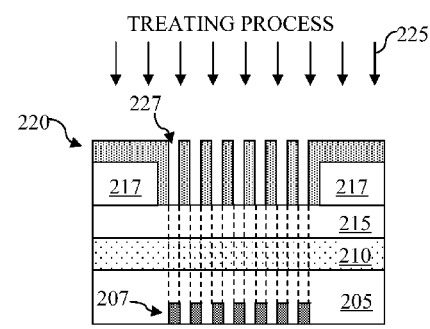

Referring to FIG. 2B, the opening 218 is filled by a polymer layer 220 that is similar to the polymer layer 120 of FIG. 1. Referring to FIG. 2C, a treating process 225 similar to the treating process 125 of FIG. 1 is performed on the polymer layer 220 to form openings 227 that are similar to the openings 127 of FIG. 1. The patterned mask 217 ensures that the self-assembly of the nano-sized features (formed by remaining portions of the polymer layer 220 after the treating process 225) takes place within the opening 218. These nano-sized features may also be referred to as microscopic features or microscopic masks. Since the nano-sized features are evenly spaced, and the size or width of the openings 227 is tunable, the openings 227 can be made to properly align with the array of devices 207. Thus, the contacts, vias, or conductive lines that will be formed later using the openings 227 are also approximately aligned with the array of devices in the layer 205. In essence, the patterned mask 217 guides the nano-sized features to be approximately aligned with the array of devices in the layer 205. Hence, the patterned mask 217 may also be referred to as a guiding layer.

Figure 2D:
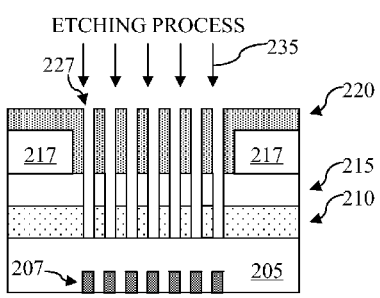
Figure 2E:
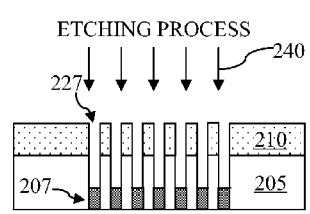
Figure 2F:

Referring now to FIG. 2D, an etching process 235 is performed on the layers 215 and 210 to extend the openings 227 through the layers 215 and 210, such that portions of the layer 205 are exposed. Referring to FIG. 2E, an etching process 240 is performed on the layer 205 to extend the openings 227 into the layer 205. Referring now to FIG. 2F, the layer 210 is removed, and the openings 227 are filled with a conductive material to form an array of interconnection features 244, such as contacts, vias, or conductive lines 244. The array of interconnection features 244 are approximately aligned with the array of devices 207. Note that for drawings that are illustrated below, features similar to the array of devices 207 are not illustrated for purposes of simplicity, but it is understood that these similar features may be formed and that their alignment with interconnection features above may be improved through similar uses of the guiding layers shown in the drawings below.

Figure 3A:
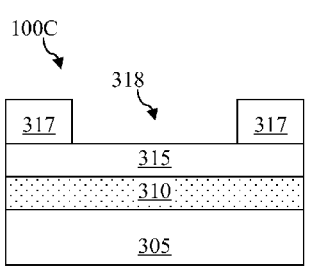

Illustrated in FIGS. 3A-3I are diagrammatic fragmentary cross-sectional side views of the semiconductor device 100C during various fabrication stages in accordance with yet another embodiment of the present disclosure. The embodiment described below with reference to FIGS. 3A-3I is similar to the embodiment described with reference to FIGS. 1A-1E. The differences will be discussed below. Referring now to FIG. 3A, the semiconductor device 100C includes a layer 305 similar to the layer 105 of FIG. 1. A hard mask layer 310 similar to the hard mask layer 110 of FIG. 1 is formed over the layer 305. A polymer layer 315 similar to the polymer layer 115 of FIG. 1 is then formed over the hard mask layer 310. Thereafter, a patterned mask 317 is formed over the polymer layer 315. The patterned mask 317 includes a material that is similar to the patterned mask 130 of FIG. 1. The patterned mask 317 includes an opening 318.

Figure 3B:
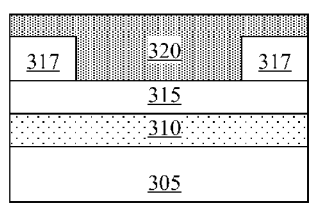
Figure 3C:
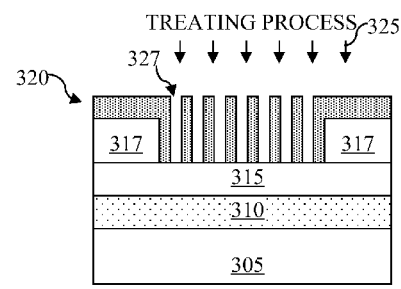
Figure 3D:
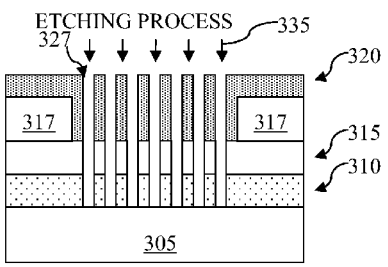
Figure 3E:
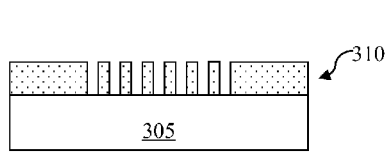
Figure 3F:
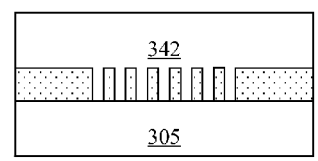

Referring to FIG. 3B, the opening 318 is filled by a polymer layer 320 that is similar to the polymer layer 120 of FIG. 1. Referring to FIG. 3C, a treating process 325 similar to the treating process 125 of FIG. 1 is performed on the polymer layer 320 to form openings 327 that are similar to the openings 127 of FIG. 1. Referring now to FIG. 2D, an etching process 335 is performed on the layers 315 and 310 to extend the openings 327 through the layers 315 and 310, such that portions of the layer 305 are exposed. Referring to FIG. 3E, the layers 315, 317, and 320 are removed. Referring to FIG. 3F, a layer 342 is formed over the hard mask layer 310. The layer 342 includes a material that is similar to the material of the layer 130 of FIG. 1. The layer 342 has an etch rate that is different from the etch rates of the polymer layers 315 and 320. In an embodiment, the layer 342 includes silicon. In another embodiment, the layer 342 includes metal.

Figure 3G:
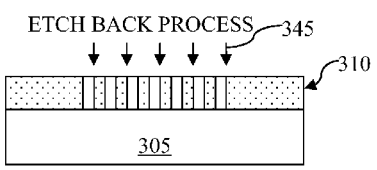
Figure 3H:
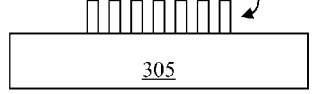
Figure 3I:
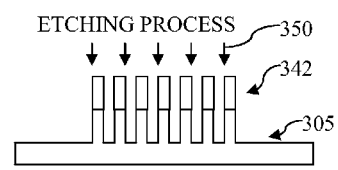

Referring to FIG. 3G, an etch back process 345 is performed on the layer 342 so that portions of the layer 342 filling the openings 327 are substantially co-planar with the hard mask layer 310. Referring to FIG. 3H, the hard mask layer 310 is removed. Referring now to FIG. 3I, an etching process 350 is performed on the layer 305, using portions of the layer 342 as a mask. Portions of the layer 305 not protected by the layer 342 are etched away.

In the embodiment described above in association with FIGS. 3A-3I, the patterned mask 317 serves as a guiding layer similar to the guiding layer 217 described above with reference FIG. 2.

Figure 4A:
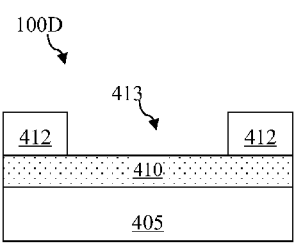

Illustrated in FIGS. 4A-4E are diagrammatic fragmentary cross-sectional side views of the semiconductor device 100D during various fabrication stages in accordance with one or more embodiments of the present disclosure. The embodiment described below with reference to FIGS. 4A-4E is similar to the embodiment described with reference to FIGS. 1A-1E. The differences will be discussed below. Referring now to FIG. 4A, the semiconductor device 100D includes a layer 405 similar to the layer 105 of FIG. 1. A hard mask layer 410 similar to the hard mask layer 110 of FIG. 1 is formed over the layer 405. Thereafter, a patterned mask 412 is formed over the hard mask layer 410. The patterned mask 412 includes a material that is similar to the patterned mask 130 of FIG. 1. The patterned mask 412 includes an opening 413.

Figure 4B:
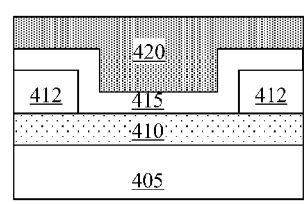

Referring to FIG. 4B, a polymer layer 415 similar to the polymer layer 115 of FIG. 1 is formed over the hard mask layer 410 and the patterned mask 412. Thereafter, a polymer layer 420 similar to the polymer layer 120 of FIG. 1 is formed over the polymer layer 415.

Figure 4C:
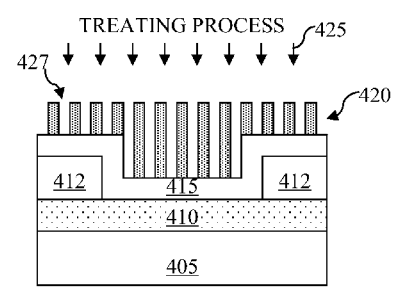
Figure 4D:
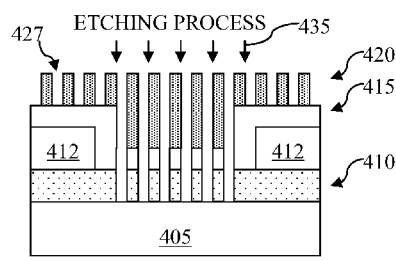
Figure 4E:
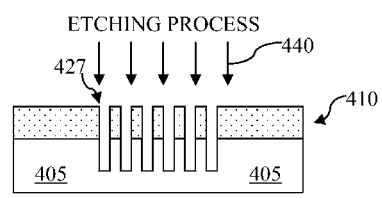

Referring to FIG. 4C, a treating process 425 similar to the treating process 125 of FIG. 1 is performed on the polymer layer 420 to form openings 427 that are similar to the openings 127 of FIG. 1. Referring now to FIG. 4D, an etching process 435 is performed on the layers 415 and 410 to extend the openings 427 through the layers 415 and 410, such that portions of the layer 405 are exposed. Referring to FIG. 4E, an etching process 440 is performed on the layer 405 to extend the openings 427 into the layer 405.

In the embodiment described above in association with FIGS. 4A-4E, the patterned mask 412 serves as a guiding layer similar to the guiding layer 217 described above with reference to FIG. 2.

Figure 5A:
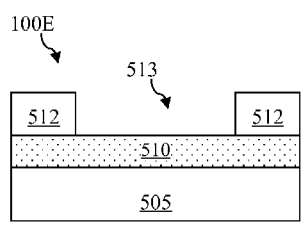

Illustrated in FIGS. 5A-5I are diagrammatic fragmentary cross-sectional side views of the semiconductor device 100E during various fabrication stages in accordance with a further embodiment of the present disclosure. The embodiment described below with reference to FIGS. 5A-5I is similar to the embodiment described with reference to FIGS. 1A-1E. The differences will be discussed below. Referring now to FIG. 5A, the semiconductor device 100E includes a layer 505 similar to the layer 105 of FIG. 1. A hard mask layer 510 similar to the hard mask layer 110 of FIG. 1 is formed over the layer 505. Thereafter, a patterned mask 512 is formed over the hard mask layer 510. The patterned mask 512 includes a material that is similar to the patterned mask 130 of FIG. 1. The patterned mask 512 includes an opening 513.

Figure 5B:
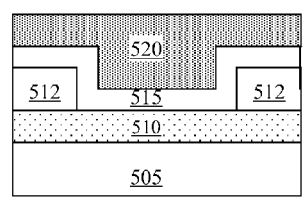

Referring to FIG. 5B, a polymer layer 515 similar to the polymer layer 115 of FIG. 1 is formed over the hard mask layer 510 and the patterned mask 512. Thereafter, a polymer layer 520 similar to the polymer layer 120 of FIG. 1 is formed over the polymer layer 515.

Figure 5C:
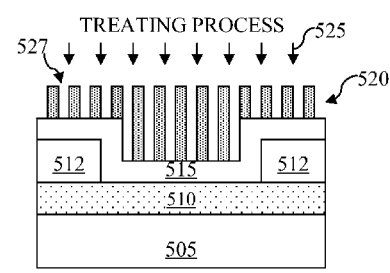
Figure 5D:
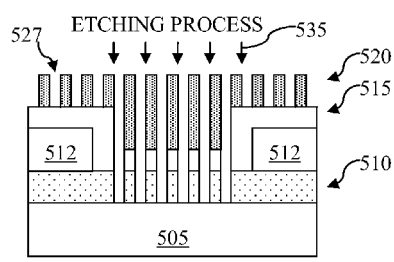

Referring to FIG. 5C, a treating process 525 similar to the treating process 125 of FIG. 1 is performed on the polymer layer 520 to form openings 527 that are similar to the openings 127 of FIG. 1. Referring now to FIG. 5D, an etching process 535 is performed on the layers 515 and 510 to extend the openings 527 through the layers 515 and 510, such that portions of the layer 505 are exposed.

Figure 5E:
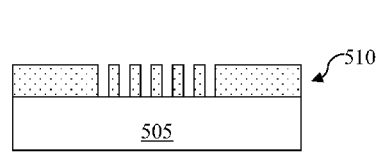
Figure 5F:
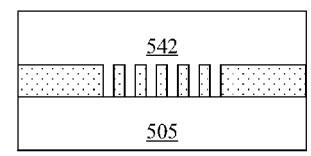
Figure 5G:
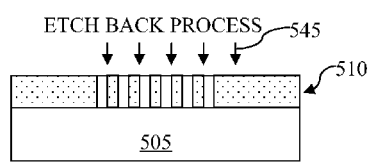
Figure 5H:
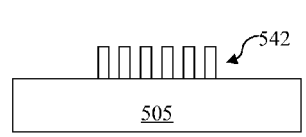
Figure 5I:
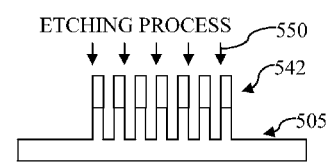

Referring to FIG. 5E, the layers 512, 515, and 520 are removed. Referring to FIG. 5F, a layer 542 similar to the layer 130 of FIG. 1 is formed over the hard mask layer 510. Referring to FIG. 5G, an etch back process 545 is performed on the layer 542 so that portions of the layer 542 filling the openings 527 are substantially co-planar with the hard mask layer 510. Referring to FIG. 5H, the hard mask layer 510 is removed. Referring now to FIG. 5I, an etching process 550 is performed on the layer 505, using portions of the layer 542 as a mask. Portions of the layer 505 not protected by the layer 542 are etched away.

In the embodiment described above in association with FIGS. 5A-5I, the patterned mask 512 serves as a guiding layer similar to the guiding layer 217 described above with reference to FIG. 2.

Figure 6A:
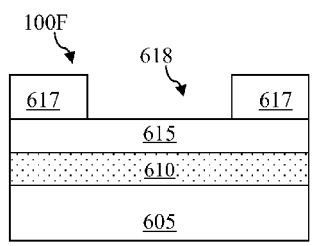

Illustrated in FIGS. 6A-6G are diagrammatic fragmentary cross-sectional side views of the semiconductor device 100F during various fabrication stages in accordance with another embodiment of the present disclosure. The embodiment described below with reference to FIGS. 6A-6G is similar to the embodiment described with reference to FIGS. 1A-1E. The differences will be discussed below. Referring now to FIG. 6A, the semiconductor device 100F includes a layer 605 similar to the layer 105 of FIG. 1. A hard mask layer 610 similar to the hard mask layer 110 of FIG. 1 is formed over the layer 605. A polymer layer 615 similar to the polymer layer 115 of FIG. 1 is then formed over the hard mask layer 610. Thereafter, a patterned mask 617 is formed over the polymer layer 615. The patterned mask 617 includes a material that is similar to the patterned mask 130 of FIG. 1. The patterned mask 617 includes an opening 618.

Figure 6B:
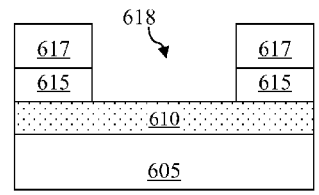
Figure 6C:
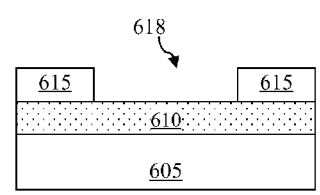

Referring to FIG. 6B, the opening 618 is extended as portions of the polymer layer 615 not protected by the patterned mask 617 are removed, so that a portion of the hard mask layer 610 is exposed. Referring to FIG. 6C, the patterned mask 617 is removed.

Figure 6D:
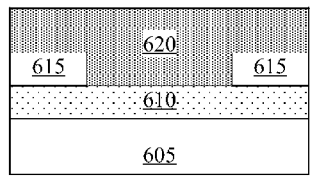
Figure 6E:
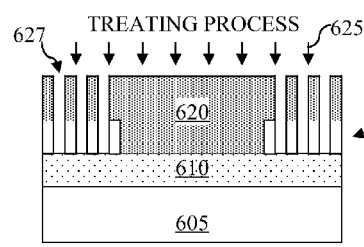
Figure 6F:
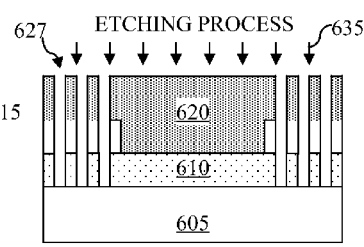
Figure 6G:
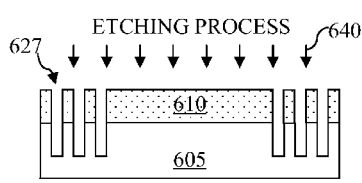

Referring to FIG. 6D, the opening 618 is filled by a polymer layer 620 that is similar to the polymer layer 120 of FIG. 1. Referring to FIG. 6E, a treating process 625 similar to the treating process 125 of FIG. 1 is performed on the polymer layer 620 to form openings 627 that are similar to the openings 127 of FIG. 1. Referring now to FIG. 6F, an etching process 635 is performed on the layers 615 and 610 to extend the openings 627 through the layers 615 and 610, such that portions of the layer 605 are exposed. Referring to FIG. 6G, the layers 615 and 620 are removed, and an etching process 640 is performed on the layer 605 to extend the openings 627 into the layer 605. The openings 627 may then be filled with a conductive material to form an array of contacts, vias, or conductive lines.

In the embodiment described above in association with FIGS. 6A-6G, the patterned mask 617 serves as a guiding layer similar to the guiding layer 217 described with reference to FIG. 2.

Figure 7A:
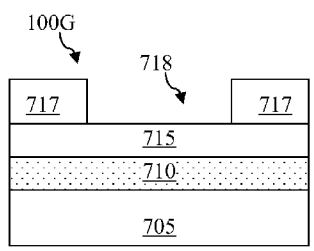

Illustrated in FIGS. 7A-7I are diagrammatic fragmentary cross-sectional side views of the semiconductor device 100G during various fabrication stages in accordance with another embodiment of the present disclosure. The embodiment described below in association with FIGS. 7A-7I is similar to the embodiment described in association with FIGS. 1A-1E. The differences will be discussed below. Referring now to FIG. 7A, the semiconductor device 100G includes a layer 705 similar to the layer 105 of FIG. 1. A hard mask layer 710 similar to the hard mask layer 110 of FIG. 1 is formed over the layer 705. A polymer layer 715 similar to the polymer layer 115 of FIG. 1 is then formed over the hard mask layer 710. Thereafter, a patterned mask 717 is formed over the polymer layer 715. The patterned mask 717 includes a material that is similar to the patterned mask 130 of FIG. 1. The patterned mask 717 includes an opening 718.

Figure 7B:
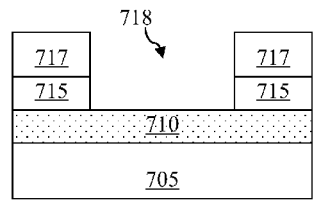
Figure 7C:
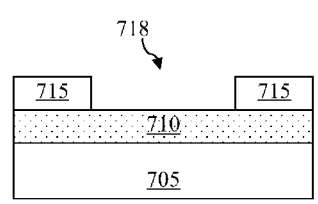

Referring to FIG. 7B, the opening 718 is extended as portions of the polymer layer 715 not covered by the patterned mask 717 is removed, so that a portion of the hard mask layer 710 is exposed. Referring to FIG. 7C, the patterned mask 717 is removed.

Figure 7D:
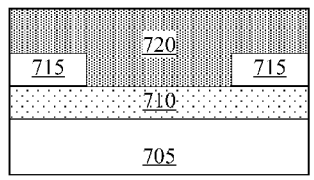
Figure 7E:
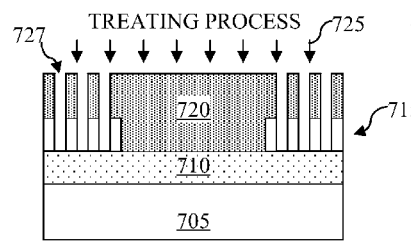
Figure 7F:
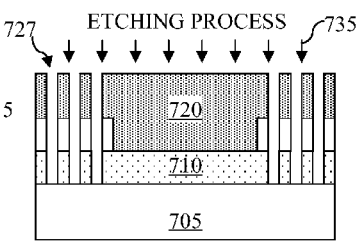

Referring to FIG. 7D, the opening 718 is filled by a polymer layer 720 that is similar to the polymer layer 120 of FIG. 1. Referring to FIG. 7E, a treating process 725 similar to the treating process 125 of FIG. 1 is performed on the polymer layer 720 to form openings 727 that are similar to the openings 127 of FIG. 1. Referring now to FIG. 7F, an etching process 735 is performed on the layers 715 and 710 to extend the openings 727 through the layers 715 and 710, such that portions of the layer 705 are exposed.

Figure 7G:
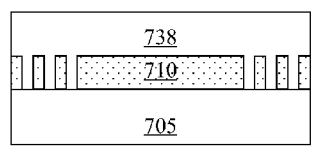
Figure 7H:
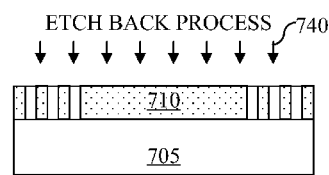
Figure 7I:
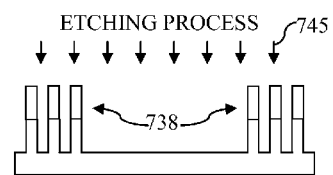

Referring to FIG. 7G, the layers 715 and 720 are removed, and a layer 738 similar to the layer 130 of FIG. 1 is formed over the hard mask layer 710. Referring to FIG. 7H, an etch back process 740 is performed on the layer 738 so that portions of the layer 738 filling the openings 727 are substantially co-planar with the hard mask layer 710. Referring to FIG. 7I, an etching process 745 is performed on the layer 705, using portions of the layer 738 as a mask. Portions of the layer 705 not protected by the layer 738 are etched away.

In the embodiment described above in association with FIGS. 7A-7I, the patterned mask 717 serves as a guiding layer similar to the guiding layer 217 described with reference to FIG. 2.

For the embodiments described above with reference to FIGS. 1-7, two polymer layers (for example the polymer layer 115 and 120 in FIG. 1) are used in each of the embodiments. The embodiments described below use a single polymer layer but are otherwise similar to the embodiments described above.

Figure 8A:
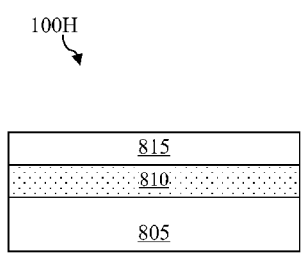

Illustrated in FIGS. 8A-8E are diagrammatic fragmentary cross-sectional side views of the semiconductor device 100H during various fabrication stages in accordance with a further embodiment of the present disclosure. Referring now to FIG. 8A, the semiconductor device 100H includes a layer 805 similar to the layer 105 of FIG. 1. A hard mask layer 810 is formed over the layer 805. The hard mask layer 810 includes a dielectric material such as silicon oxide, silicon nitride, or silicon oxynitride. Alternatively, the hard mask layer 810 may include a metallic material such as chromium. Referring back to FIG. 8A, a polymer layer 815 similar to the polymer layer 120 of FIG. 1 is then formed over the hard mask layer 810.

In FIG. 8A, the hard mask layer 810 is the layer that interfaces with the polymer layer 815. An interfacial energy (or boundary energy) exists between the hard mask layer 810 and the polymer layer 815. The interfacial energy is related to the material composition of the hard mask layer 810 and the polymer layer 815. This interfacial energy causes a greater affinity to exist between either the hard mask layer 810 and the PS components of the polymer layer 815 or the hard mask layer 810 and the PMMA components of the polymer layer 815. Depending on which affinity is greater, the morphology of the diblock copolymer is determined. It is understood that the hard mask layer 810 may have a material composition that is different than the material composition of the hard mask layer 110 of FIG. 1, so as to effectuate the desired morphology for the polymer layer 815. Thus, for reasons similar to those described above in association with FIGS. 1A-1E, either a cylindrical or a lamella shaped diblock copolymer molecule may be obtained by adjusting the material compositions of the hard mask layer 810 and the polymer layer 815.

Figure 8B:
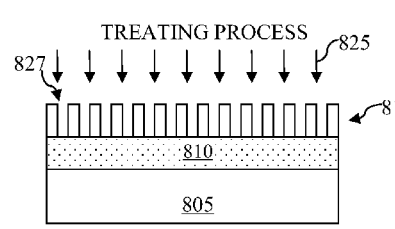
Figure 8C:
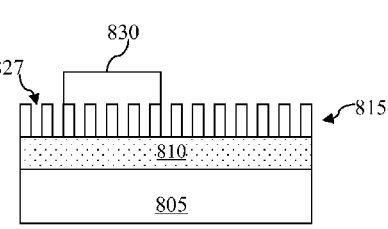

Referring to FIG. 8B, a treating process 825 similar to the treating process 125 of FIG. 1 is performed on the polymer layer 815 to facilitate the microphase separation of the polymer layer 815 and to form openings 827 that are similar to the openings 127 of FIG. 1. Referring now to FIG. 8C, a patterned mask 830 similar to the patterned mask 130 of FIG. 1C is formed in the unpack or decode region of the semiconductor device 100H.

Figure 8D:
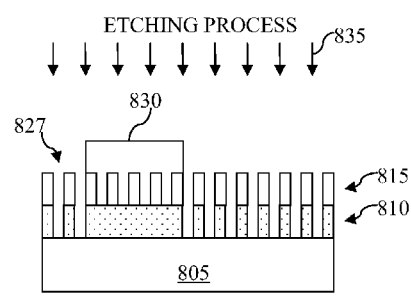
Figure 8E:
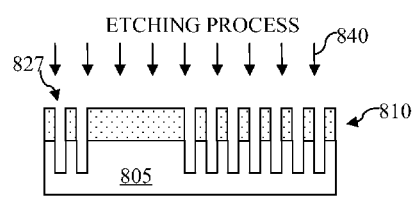

Referring now to FIG. 8D, an etching process 835 is performed on the layer 810 to extend the openings 827 through the layer 810, such that portions of the layer 805 are exposed. Referring to FIG. 8E, an etching process 840 is performed on the layer 805 to extend the openings 827 into the layer 805. The openings 827 may then be filled with a conductive material to form an array of contacts, vias, or conductive lines.

In the embodiment described above in association with FIGS. 8A-8E, the patterned mask 830 serves as a guiding layer similar to the patterned mask 130 described above with reference to FIG. 1.

Figure 9A:
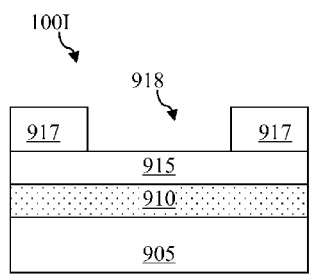

Illustrated in FIGS. 9A-9E are diagrammatic fragmentary cross-sectional side views of the semiconductor device 100I during various fabrication stages in accordance with another embodiment of the present disclosure. Referring now to FIG. 9A, the semiconductor device 100I includes a layer 905 similar to the layer 105 of FIG. 1. A hard mask layer 910 similar to the hard mask layer 810 of FIG. 8 is formed over the layer 905. A polymer layer 915 similar to the polymer layer 120 of FIG. 1 is then formed over the hard mask layer 910. Thereafter, a patterned mask 917 similar to the patterned mask 217 of FIG. 2 is formed over the polymer layer 915. The patterned mask 917 includes an opening 918.

Figure 9B:
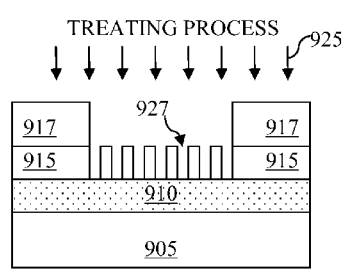
Figure 9C:
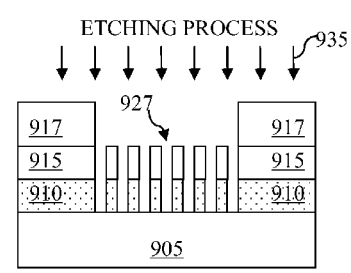

Referring to FIG. 9B, a treating process 925 similar to the treating process 125 of FIG. 1 is performed on the polymer layer 915 to form openings 927 that are similar to the openings 127 of FIG. 1. Referring now to FIG. 9C, an etching process 935 is performed on the layer 910 to extend the openings 927 through the layer 910, such that portions of the layer 905 are exposed.

Figure 9D:
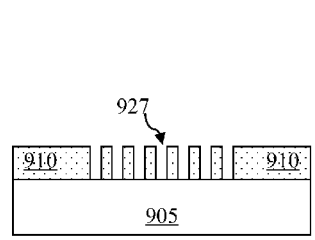
Figure 9E:
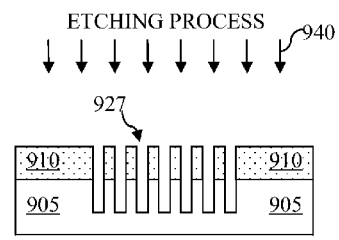

Referring now to FIG. 9D, the layers 915 and 917 are removed. Referring to FIG. 9E, an etching process 940 is performed on the layer 905 to extend the openings 927 into the layer 905. The openings 927 may then be filled with a conductive material to form an array of contacts, vias, or conductive lines.

In the embodiment described above in association with FIGS. 9A-9E, the patterned mask 917 serves as a guiding layer similar to the patterned mask 217 described with reference to FIG. 2.

Illustrated in FIGS. 10A-10H are diagrammatic fragmentary cross-sectional side views of the semiconductor device 100J during various fabrication stages in accordance with a further embodiment of the present disclosure. Referring now to FIG. 10A, the semiconductor device 100J includes a layer 1005 similar to the layer 105 of FIG. 1. A hard mask layer 1010 similar to the hard mask layer 810 of FIG. 8 is formed over the layer 1005. A polymer layer 1015 similar to the polymer layer 120 of FIG. 1 is then formed over the hard mask layer 1010. Thereafter, a patterned mask 1017 similar to the patterned mask 217 of FIG. 2 is formed over the polymer layer 1015. The patterned mask 1017 includes an opening 1018.

Referring to FIG. 10B, a treating process 1025 similar to the treating process 125 of FIG. 1 is performed on the polymer layer 1015 to form openings 1027 that are similar to the openings 127 of FIG. 1. Referring now to FIG. 10C, an etching process 1035 is performed on the layer 1010 to extend the openings 1027 through the layer 1010, such that portions of the layer 1005 are exposed.

Referring now to FIG. 10D, the layers 1015 and 1017 are removed. Referring to FIG. 10E, a layer 1038 similar to the layer 130 of FIG. 1 is formed over the hard mask layer 1010. Referring to FIG. 10F, an etch back process 1040 is performed on the layer 1038 so that portions of the layer 1038 filling the openings 1027 are substantially co-planar with the hard mask layer 1010.

Referring to FIG. 10G, the hard mask layer 1010 is removed. Referring now to FIG. 10H, an etching process 1045 is performed on the layer 1005, using portions of the layer 1038 as a mask. Portions of the layer 1005 not protected by the layer 1038 are etched away.

In the embodiment described above in association with FIGS. 10A-10E, the patterned mask 1017 serves as a guiding layer similar to the patterned mask 217 described with reference to FIG. 2.

Figure 11A:
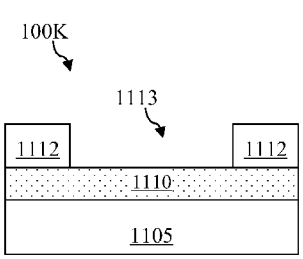

Illustrated in FIGS. 11A-11F are diagrammatic fragmentary cross-sectional side views of the semiconductor device 100K during various fabrication stages in accordance with another embodiment of the present disclosure. Referring now to FIG. 11A, the semiconductor device 100K includes a layer 1105 similar to the layer 105 of FIG. 1. A hard mask layer 1110 similar to the hard mask layer 810 of FIG. 8 is formed over the layer 1105. Thereafter, a patterned mask 1112 similar to the patterned mask 217 of FIG. 2 is formed over the hard mask 1110. The patterned mask 1112 includes an opening 1113.

Figure 11B:
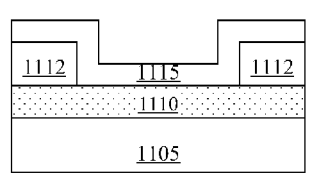
Figure 11C:
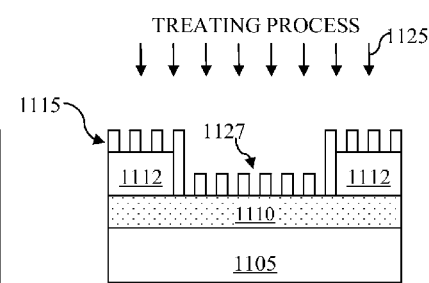
Figure 11D:
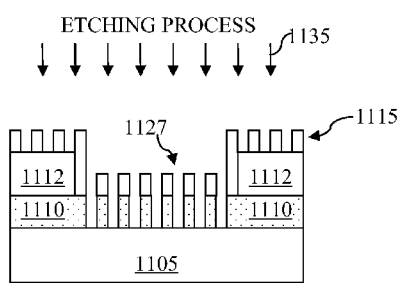

Referring to FIG. 11B, a polymer layer 1115 similar to the polymer layer 120 of FIG. 1 is formed over the hard mask layer 1110 and the patterned mask 1112. Referring to FIG. 11C, a treating process 1125 similar to the treating process 125 of FIG. 1 is performed on the polymer layer 1115 to form openings 1127 that are similar to the openings 127 of FIG. 1. Referring now to FIG. 11D, an etching process 1135 is performed on the layer 1110 to extend the openings 1127 through the layer 1110, such that portions of the layer 1105 are exposed.

Figure 11E:
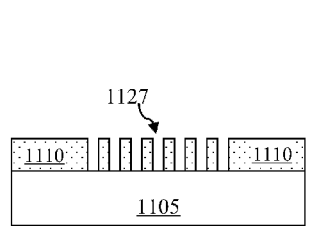
Figure 11F:
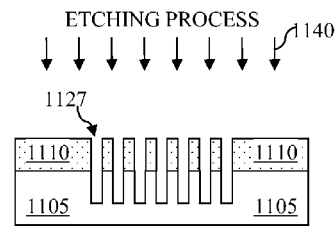

Referring now to FIG. 11E, the layers 1115 and 1112 are removed. Referring to FIG. 11F, an etching process 1140 is performed on the layer 1105 to extend the openings 1127 into the layer 1105.

In the embodiment described above in association with FIGS. 11A-11F, the patterned mask 1112 serves as a guiding layer similar to the patterned mask 217 described above with reference to FIG. 2.

Figure 12A:
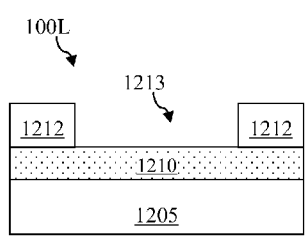

Illustrated in FIGS. 12A-12I are diagrammatic fragmentary cross-sectional side views of the semiconductor device 100L during various fabrication stages in accordance with yet another embodiment of the present disclosure. Referring now to FIG. 12A, the semiconductor device 100L includes a layer 1205 similar to the layer 105 of FIG. 1. A hard mask layer 1210 similar to the hard mask layer 810 of FIG. 8 is formed over the layer 1205. Thereafter, a patterned mask 1212 similar to the patterned mask 217 of FIG. 2 is formed over the hard mask 1210. The patterned mask 1112 includes an opening 1213.

Figure 12B:
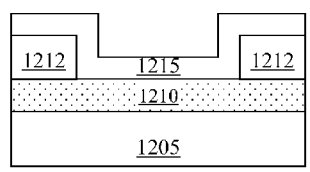
Figure 12C:
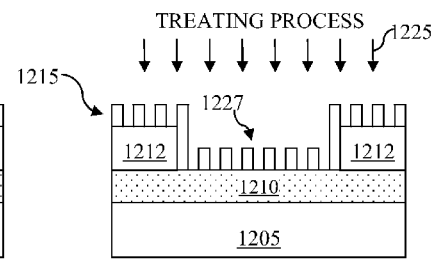
Figure 12D:
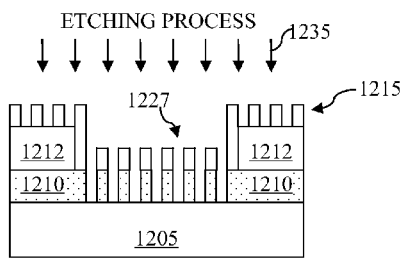

Referring to FIG. 12B, a polymer layer 1215 similar to the polymer layer 120 of FIG. 1 is formed over the hard mask layer 1210 and the patterned mask 1212. Referring to FIG. 12C, a treating process 1225 similar to the treating process 125 of FIG. 1 is performed on the polymer layer 1215 to form openings 1227 that are similar to the openings 127 of FIG. 1. Referring now to FIG. 12D, an etching process 1235 is performed on the layer 1210 to extend the openings 1227 through the layer 1210, such that portions of the layer 1205 are exposed.

Figure 12E:
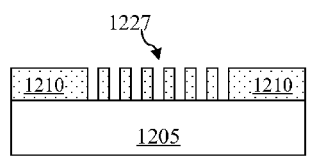
Figure 12F:
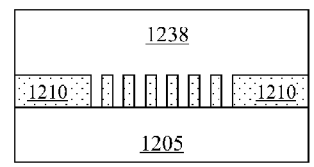
Figure 12G:
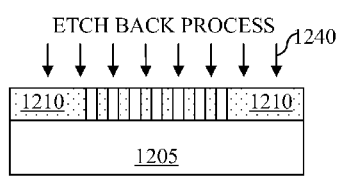
Figure 12H:
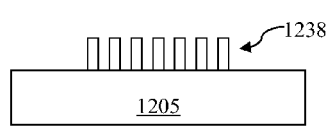
Figure 12I:
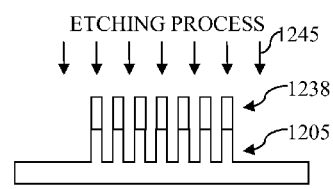

Referring now to FIG. 12E, the layers 1215 and 1212 are removed. Referring to FIG. 102F, a layer 1238 similar to the layer 130 of FIG. 1 is formed over the hard mask layer 1210. Referring to FIG. 12G, an etch back process 1240 is performed on the layer 1238 so that portions of the layer 1238 filling the openings 1227 are substantially co-planar with the hard mask layer 1210. Referring to FIG. 12H, the hard mask layer 1210 is removed. Referring now to FIG. 12I, an etching process 1245 is performed on the layer 1205, using portions of the layer 1238 as a mask. Portions of the layer 1205 not protected by the layer 1238 are etched away.

In the embodiment described above in association with FIGS. 12A-12I, the patterned mask 1212 serves as a guiding layer similar to the patterned mask 217 described with reference to FIG. 2.

Figure 13A:
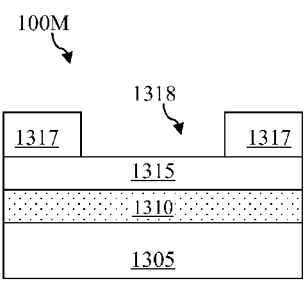

Illustrated in FIGS. 13A-13F are diagrammatic fragmentary cross-sectional side views of the semiconductor device 100M during various fabrication stages in accordance with a further embodiment of the present disclosure. Referring now to FIG. 13A, the semiconductor device 100M includes a layer 1305 similar to the layer 105 of FIG. 1. A hard mask layer 1310 similar to the hard mask layer 810 of FIG. 8 is formed over the layer 1305. A polymer layer 1315 similar to the polymer layer 120 of FIG. 1 is then formed over the hard mask layer 1310. Thereafter, a patterned mask 1317 similar to the patterned mask 217 of FIG. 2 is formed over the polymer layer 1315. The patterned mask 1317 includes an opening 1318.

Figure 13B:
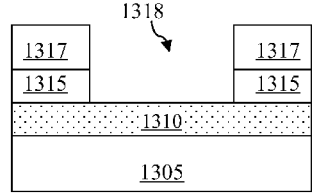
Figure 13C:
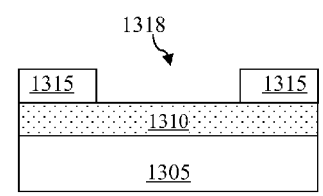
Figure 13D:
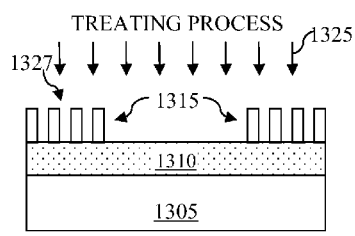

Referring to FIG. 13B, the opening 1318 is extended as portions of the polymer layer 1315 not covered by the patterned mask 1317 is removed, so that a portion of the hard mask layer 1310 is exposed. Referring to FIG. 13C, the patterned mask 1317 is removed. Referring to FIG. 13D, a treating process 1325 similar to the treating process 125 of FIG. 1 is performed on the polymer layer 1315 exposed by the opening 1318 to form openings 1327 that are similar to the openings 127 of FIG. 1.

Figure 13E:
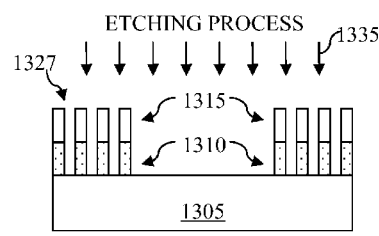
Figure 13F:
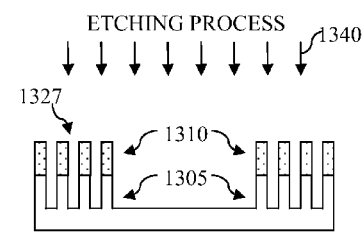

Referring now to FIG. 13E, an etching process 1335 is performed on the layer 1310 to extend the openings 1327 through the layer 1310, such that portions of the layer 1305 are exposed. Referring now to FIG. 13F, the layer 1315 is removed and an etching process 1340 is performed on the layer 1305 to extend the openings 1327 into the layer 1305.

In the embodiment described above in association with FIGS. 13A-13F, the patterned mask 1317 serves as a guiding layer similar to the patterned mask 217 described above with reference to FIG. 2.

Figure 14A:
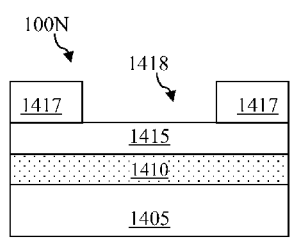

Illustrated in FIGS. 14A-14F are diagrammatic fragmentary cross-sectional side views of the semiconductor device 100N during various fabrication stages in accordance with an alternative embodiment of the present disclosure. Referring now to FIG. 14A, the semiconductor device 100N includes a layer 1405 similar to the layer 105 of FIG. 1. A hard mask layer 1410 similar to the hard mask layer 810 of FIG. 8 is formed over the layer 1405. A polymer layer 1415 similar to the polymer layer 120 of FIG. 1 is then formed over the hard mask layer 1410. Thereafter, a patterned mask 1417 similar to the patterned mask 217 of FIG. 2 is formed over the polymer layer 1415. The patterned mask 1417 includes an opening 1418.

Figure 14B:
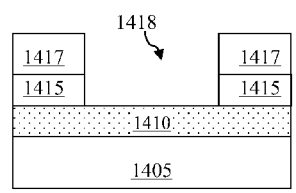
Figure 14C:
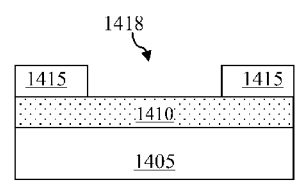
Figure 14D:
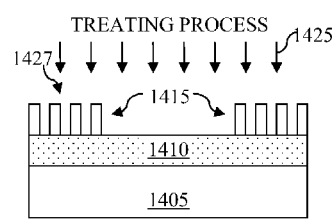

Referring to FIG. 14B, the opening 1418 is extended as portions of the polymer layer 1415 not covered by the patterned mask 1417 is removed, so that a portion of the hard mask layer 1410 is exposed. Referring to FIG. 14C, the patterned mask 1417 is removed. Referring to FIG. 14D, a treating process 1425 similar to the treating process 125 of FIG. 1 is performed on the polymer layer 1415 exposed by the opening 1418 to form openings 1427 that are similar to the openings 127 of FIG. 1.

Figure 14E:
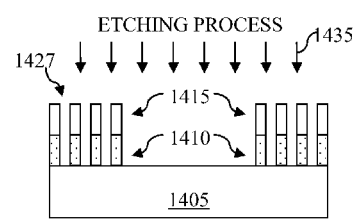
Figure 14F:
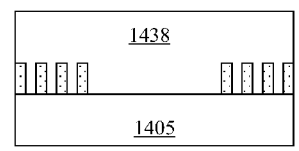
Figure 14G:
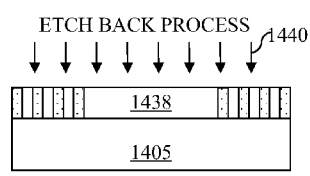
Figure 14H:
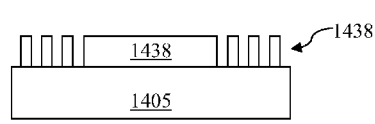
Figure 14I:
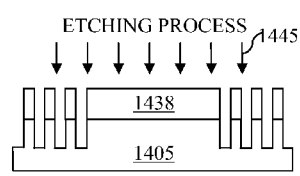

Referring now to FIG. 14E, an etching process 1435 is performed on the layer 1410 to extend the openings 1427 through the layer 1410, such that portions of the layer 1405 are exposed. Referring now to FIG. 14F, the polymer layer 1415 is removed, and a layer 1438 similar to the layer 130 of FIG. 1 is formed over the hard mask layer 1410. Referring to FIG. 14G, an etch back process 1440 is performed on the layer 1438 so that portions of the layer 1438 filling the openings 1427 are substantially co-planar with the hard mask layer 1410. Referring to FIG. 14H, the hard mask layer 1410 is removed. Referring now to FIG. 14I, an etching process 1445 is performed on the layer 1405, using portions of the layer 1438 as a mask. Portions of the layer 1405 not protected by the layer 1438 are etched away.

In the embodiment described above in association with FIGS. 14A-14I, the patterned mask 1417 serves as a guiding layer similar to the patterned mask 217 described above with reference to FIG. 2.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
providing a substrate, wherein the substrate has an unpack region;
forming a material layer over the substrate;
forming a polymer layer over the material layer;
self-assembling a nano-sized feature using a portion of the polymer layer;
forming a soft mask over the polymer layer and over the unpack region of the substrate; and
patterning the substrate using the nano-sized feature, wherein the soft mask is operable to protect the layers therebelow during the patterning the substrate.

2. The method of claim 1, wherein the self-assembling the nano-sized feature comprises forming two nano-sized features that are separated by an opening, and wherein the patterning the substrate comprises extending the opening into the substrate.

3. The method of claim 2, further comprising:
before the forming the material layer, forming a microelectronic device in the substrate; and
filling the opening with a conductive material to form an interconnection feature;
wherein the self-assembling the nano-sized feature is carried out so that the opening is approximately aligned with the microelectronic device in the substrate.

4. The method of claim 1, further comprising forming a guiding mask having an opening, such that the portion of the polymer layer is confined within the opening.

5. The method of claim 1, wherein the forming the polymer layer comprises forming a first diblock copolymer as the polymer layer, the first diblock copolymer layer having first and second components.

6. The method of claim 5, wherein the self-assembling the nano-sized feature comprises:
treating the polymer layer by one of baking, ultraviolet curing, laser annealing, flash annealing, plasma treating, ion bombardment, and cross-linking removing the second component; and
removing the second component, so that the first component forms the nano-sized feature.

7. The method of claim 5, wherein a solvent polarity of the polymer layer is different from a solvent polarity of the material layer.

8. The method of claim 5, wherein the forming the first diblock copolymer is carried out so that the first component comprises polystyrene and the second component comprises polymethyl methacrylate, and wherein a volume ratio of the first and second components is in a range from about 2.33:1 to about 4:1.

9. The method of claim 5, wherein the material layer is one of a hard mask layer and a second diblock copolymer layer having polystyrene as its first component and polymethyl methacrylate as its second component.

10. The method of claim 9, wherein the forming the polymer layer is carried out so that the polymer layer includes a thickness that is in a range from about 15 nm to about 60 nm, and wherein:
if the material layer is the hard mask layer, the material layer includes a further thickness that is in a range from about 50 nm to about 100 nm; and
if the material layer is the second diblock copolymer layer, the material layer includes a further thickness that is in a range from about 2.5 nm to about 10 nm.

11. The method of claim 9, further comprising selecting a desired morphology of the first diblock copolymer layer by one of:
tuning a volume ratio of the first and second components of the second diblock copolymer layer; and
tuning a size difference between the first and second components of the first diblock copolymer layer.

12. A method of fabricating a semiconductor device, comprising:
providing a substrate;
forming a first material layer over the substrate;
forming a guiding layer over the first material layer, the guiding layer having a recess;
forming a polymer layer within the recess, the polymer layer having a plurality of first and second components;
treating the polymer layer to facilitate a separation of the plurality of first and second components;
removing the plurality of second components, thereby forming a plurality of openings within the polymer layer;
extending the openings into the first material layer;
forming a second material layer over the first material layer, the second material layer containing a different material from the first material layer, the second material layer completely filling the openings;
performing an etch back process on the second material layer in a manner such that the second material layer and the first material layer are substantially coplanar;
removing the first material layer; and
patterning the substrate with the second material layer.

13. The method of claim 12,
wherein the first material layer is a hard mask layer, and wherein the second material layer includes at least one of silicon and metal.

14. The method of claim 12, wherein the separation of the first and second components is a microphase separation.

15. A method of fabricating a semiconductor device, comprising:
providing a substrate;
forming a material layer over the substrate, the material layer containing a polymer-free material;
forming a guiding layer over the material layer, the guiding layer having a recess over a region of the substrate;
forming a polymer layer within the recess, wherein an interfacial energy exists between the material layer and the polymer layer;
transforming the polymer layer into a mask that has a predetermined structure that is associated with the interfacial energy; and
performing a patterning process using the mask.

16. The method of claim 15, wherein the forming the polymer layer is carried out so that the polymer layer comprises first and second components having a size difference, and wherein the predetermined structure is a function of a material composition of the material layer and the size difference.

17. The method of claim 15, wherein the transforming the polymer layer comprises forming the mask so that the mask has a plurality of approximately evenly-spaced openings, and wherein the performing the patterning process comprises extending the openings into the substrate.

18. The method of claim 17, further comprising filling the openings in the substrate with a conductive material to form interconnection features.

19. The method of claim 15, wherein the material layer contains at least one of a dielectric material and a metallic material.

20. The method of claim 15, wherein the substrate contains a decode region, and further comprising forming a mask over the decode region, the masking protecting the decode region from being patterned during the patterning process.

* * * * *